(12) United States Patent
Yamamoto

(10) Patent No.: US 11,171,056 B2
(45) Date of Patent: Nov. 9, 2021

(54) WAFER PROCESSING METHOD

(71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 68 days.

(21) Appl. No.: 16/041,035

(22) Filed: Jul. 20, 2018

(65) Prior Publication Data
US 2019/0035689 A1 Jan. 31, 2019

(30) Foreign Application Priority Data
Jul. 28, 2017 (JP) .............................. JP2017-146720

(51) Int. Cl.
*H01L 21/822* (2006.01)
*G06T 7/00* (2017.01)
*H01L 21/67* (2006.01)
*H01L 21/82* (2006.01)
*H01L 21/683* (2006.01)
*H01L 21/687* (2006.01)
(Continued)

(52) U.S. Cl.
CPC ............ *H01L 21/822* (2013.01); *G06T 7/001* (2013.01); *G06T 7/0008* (2013.01); *H01L 21/3043* (2013.01); *H01L 21/67092* (2013.01); *H01L 21/67265* (2013.01); *H01L 21/67288* (2013.01); *H01L 21/6836* (2013.01); *H01L 21/68728* (2013.01); *H01L 21/8213* (2013.01); *H01L 22/12* (2013.01); *G06T 2207/10048* (2013.01); *G06T 2207/30148* (2013.01); *H01L 2221/68327* (2013.01)

(58) Field of Classification Search
CPC ......... G06T 2207/30148; G06T 7/0008; G06T 2207/10048; G06T 7/001; H01L 21/3043; H01L 21/67092; H01L 21/67265; H01L 21/67288; H01L 21/6836; H01L 21/68728; H01L 21/8213; H01L 21/822; H01L 2221/68327; H01L 22/12
See application file for complete search history.

(56) References Cited

U.S. PATENT DOCUMENTS

2005/0090077 A1* 4/2005 Nagai .................. B28D 5/0011
438/464
2007/0275541 A1* 11/2007 Harris ..................... H01L 21/78
438/460
(Continued)

FOREIGN PATENT DOCUMENTS

JP          2009246015 A     10/2009

*Primary Examiner* — Jaime M Holliday
(74) *Attorney, Agent, or Firm* — Greer Burns & Crain Ltd.

(57) ABSTRACT

A cutting method includes: disposing a dicing tape on a back surface of a wafer; holding the wafer on a chuck table through the dicing tape; causing a cutting blade to cut into the wafer held on the chuck table until the tip of the cutting blade reaches the dicing tape to form cut grooves; imaging the cut groove from the front surface side of the wafer by a first imaging section to form a picked-up image of a front surface portion of the cut groove, and imaging the cut groove from the front surface side of the wafer by a second imaging section to form a picked-up image of a back surface portion of the cut groove, thereby checking the picked-up images of the front surface portion and the back surface portion of the cut groove.

8 Claims, 7 Drawing Sheets

(51) Int. Cl.
*H01L 21/304* (2006.01)
*H01L 21/66* (2006.01)

(56) References Cited

U.S. PATENT DOCUMENTS

| | | | | |
|---|---|---|---|---|
| 2008/0102542 A1* | 5/2008 | Negishi | ............ | H01L 21/67092 |
| | | | | 438/16 |
| 2010/0067780 A1* | 3/2010 | Kawaragi | ............ | B81C 99/005 |
| | | | | 382/149 |
| 2011/0025838 A1* | 2/2011 | Ninomiya | .......... | G01N 21/9501 |
| | | | | 348/87 |
| 2011/0256665 A1* | 10/2011 | Kawai | ....................... | B24B 1/00 |
| | | | | 438/109 |
| 2013/0321811 A1* | 12/2013 | Maeda | ................... | G01B 11/14 |
| | | | | 356/400 |
| 2015/0170968 A1* | 6/2015 | Sawaki | ................... | H01L 21/78 |
| | | | | 438/5 |
| 2018/0019139 A1* | 1/2018 | Sun | ....................... | B05D 1/005 |

* cited by examiner

WAFER PROCESSING METHOD

BACKGROUND OF THE INVENTION

Field of the Invention

The present invention relates to a cutting method for cutting a workpiece having division lines (streets) by a cutting blade.

Description of the Related Art

A workpiece such as a semiconductor wafer or a glass substrate is cut along division lines (streets) by, for example, a cutting apparatus having a rotating circular cutting blade, into a plurality of chips. In the case where division by such a cutting blade is conducted, normally, kerf check is conducted after the cutting, in regard of whether or not the workpiece has been appropriately divided along the division lines, or whether or not chipping has been generated at cut grooves formed for division. Such a kerf check is, in general, conducted by imaging the cut grooves formed by the cutting by imaging means (see, for example, Japanese Patent Laid-open No. 2009-246015). In the kerf check, it is checked whether chipping at the cut grooves is present or absent and whether or not the kerf width (cut groove width) is within allowable values, and, when a trouble is generated, a treatment as a countermeasure against the trouble, such as correction of the position of the cutting blade, is performed.

SUMMARY OF THE INVENTION

In the existing configuration, however, only the cut groove or grooves on the front surface side of the workpiece are checked at the time of performing the kerf check by imaging the cut groove or grooves. Therefore, in the case where chipping or a crack larger than an allowable value has been generated on the back surface side of the workpiece or where misregistration of the cut groove by more than an allowable value from the division line has been generated, such a trouble may be found after all the workpieces have been processed, so that there is a possibility of production of defective chips.

It is therefore an object of the present invention to provide a cutting method by which the possibility of production of defective chips can be lowered.

In accordance with an aspect of the present invention, there is provided a cutting method for cutting a workpiece having division lines by a cutting blade, the cutting method including: a holding member disposing step of disposing a holding member on a back surface of the workpiece; a holding step of holding the workpiece on a holding table through the holding member; a cutting step of causing the cutting blade to cut into the workpiece held on the holding table until a tip of the cutting blade reaches the holding member, and cutting the workpiece along the division lines by the cutting blade to form cut grooves reaching the holding member; and a checking step of imaging the cut grooves formed in the cutting step from a front surface side of the workpiece by an imaging camera to form a picked-up image of the cut groove at the front surface of the workpiece, and imaging the cut groove from the front surface side of the workpiece by an IR (Infrared) camera to form a picked-up image of the cut groove at the back surface of the workpiece, thereby checking the cut groove at the front surface and at the back surface.

According to this configuration, the images of the cut groove at the front surface and the back surface of the workpiece are picked up from the front surface side of the workpiece, and, based on the picked-up images, the cut groove at the front surface and that at the back surface are checked; therefore, even when a trouble such as chipping greater than an allowable value is generated on the back surface side, it can be instantaneously detected, so that the possibility of production of defective chips can be lowered.

In this configuration, the IR camera may function also as the imaging camera. According to this configuration, the cut groove at the front surface of the workpiece and that at the back surface of the workpiece can both be imaged by a single IR camera, so that the need for an operation of switching the camera from one to the other is eliminated, and an operating step in imaging the workpiece is simplified.

Besides, in the checking step, the cut groove at the front surface may be imaged by positioning a focal point of the IR camera on the front surface of the workpiece, whereas the cut groove at the back surface may be imaged by positioning the focal point of the IR camera on the back surface of the workpiece. According to this configuration, by adjusting the focal point of the IR camera, the cut groove at the front surface of the workpiece and that at the back surface of the workpiece can both be imaged, so that an operating step at the time of imaging can be simplified.

According to the present invention, the image of the cut groove at the front surface of the workpiece and that at the back surface of the workpiece are both picked up from the front surface side of the workpiece, and, based on the picked-up images, the cut groove at the front surface and that at the back surface are checked; therefore, even in the case where a trouble such as chipping greater than an allowable value is generated on the back surface side, it can instantaneously be detected, so that the possibility of production of defective chips can be lowered.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
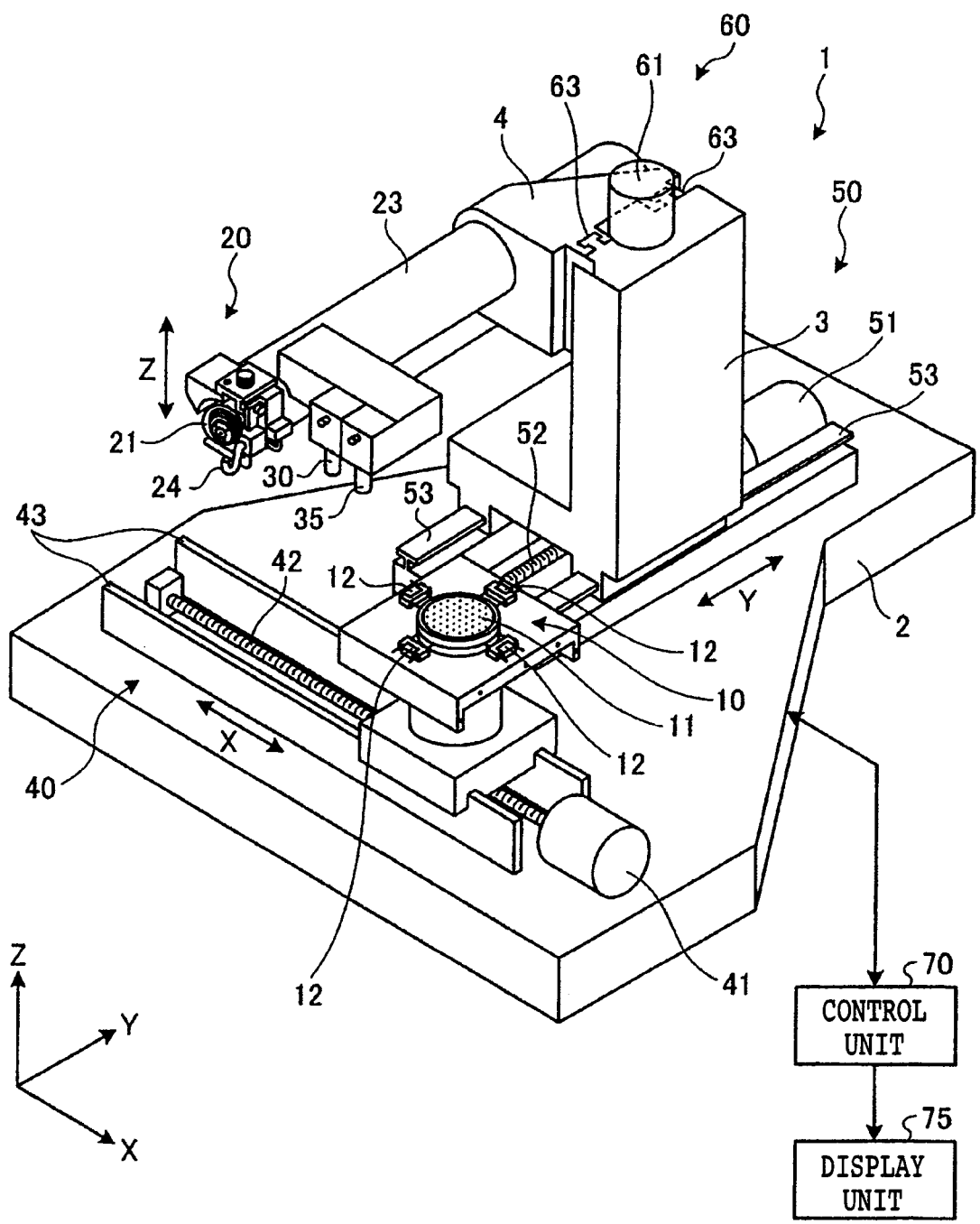
FIG. 1 is a perspective view depicting a configuration example of a cutting apparatus for use in a cutting method according to the present embodiment.

Modes (embodiments) for carrying out the present invention will be described in detail below, referring to the drawings. The contents of the following description of the embodiments are not restrictive of the invention, and the components described below include those which are easily conceivable by persons skilled in the art, and those which are substantially equivalent. Further, the configurations described below can be combined as required. In addition, various omissions, replacements and modifications are possible without departing from the gist of the invention.

Figure 2:
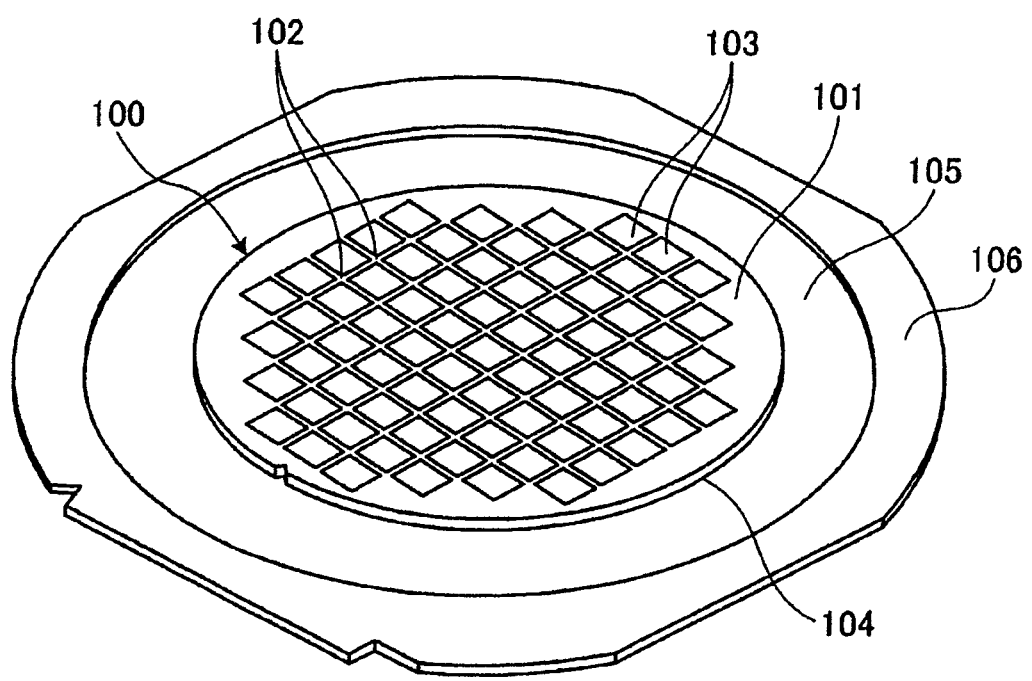
FIG. 2 is a perspective view depicting an example of a workpiece held by an annual frame.

A cutting method for a workpiece according to the present embodiment will be described below. FIG. 1 is a perspective view depicting a configuration example of a cutting apparatus for use in the cutting method according to the present invention. FIG. 2 is a perspective view depicting an example of a workpiece supported by an annual frame. As depicted in FIG. 1, the cutting apparatus 1 is configured to cut a wafer (workpiece) 100 (see FIG. 2) held on a chuck table (holding table) 10, by relative movement of the chuck table 10 and cutting means 20. The cutting apparatus 1 includes the chuck table 10, the cutting means 20, first imaging means 30, second imaging means 35, X-axis moving means 40, Y-axis moving means 50, Z-axis moving means 60, a control unit 70, and a display unit 75.

The wafer 100 as a workpiece in the present embodiment is a disk-shaped semiconductor wafer having silicon as a base material or an optical device wafer having sapphire, SiC (silicon carbide) or the like as a base material. As depicted in FIG. 2, the wafer 100 has devices 103 formed in a plurality of regions partitioned by division lines (cutting lines) 102 formed in a grid pattern on a front surface 101 thereof. The wafer 100 is supported on an annular frame 106 through a dicing tape (holding member) 105 adhered to a back surface 104 thereof. The wafer 100 is held on the chuck table 10 in the state of being supported by the annular frame 106. Note that the workpiece need only be a plate-shaped body to be cut along the division lines 102, and may not necessarily have the devices 103 in the regions partitioned by the division lines 102 like in the present embodiment. In addition, while a configuration in which the dicing tape 105 is used as the holding member is adopted in the present embodiment, other embodiments may also be adopted; for example, a hard plate of silicon, glass or the like may be adhered to the workpiece through an adhesive member such as an adhesive, a wax, a double-sided adhesive tape or the like.

As depicted in FIG. 1, the chuck table 10 includes a holding section 11 formed from a porous ceramic or the like, and a plurality of (in the present embodiment, four) clampers 12 disposed in the periphery of the holding section 11. The holding section 11 holds the wafer 100 supported on the annular frame 106, by sucking from the back surface side of the wafer 100. In this instance, the clampers 12 hold the annular frame 106 in a clamping manner. In addition, the chuck table 10 is rotatable about a center axis of the holding section 11, and can be adjusted to an arbitrary rotational angle relative to the cutting means 20.

The cutting means 20 includes a cutting blade 21, a spindle 22, a spindle housing 23, and a cutting fluid supply nozzle 24. The cutting means 20 performs processing of the wafer 100 (FIG. 2) held on the chuck table 10, while supplying a cutting fluid. In this instance, the cutting means 20 processes a region to be processed of the wafer 100 by the cutting blade 21, based on image data of the workpiece imaged by the first imaging means 30 or the second imaging means 35. The spindle 22 is accommodated in the spindle housing 23, and is rotatably supported by an air bearing. The spindle 22 is rotationally driven by a motor accommodated in the spindle housing 23, and the cutting blade 21 is detachably attached to the tip side of the spindle 22.

The cutting blade 21 cuts the workpiece held on the chuck table 10. The cutting blade 21 is an extremely thin cutting grindstone in a substantially ring-like shape. The cutting fluid supply nozzle 24 supplies the cutting fluid to a processing point of the workpiece, during processing of the workpiece by the cutting blade 21.

The first imaging means (imaging camera) 30 images the wafer 100 held on the chuck table 10 from the front surface 101 side, and generates an image of the front surface 101 of the wafer 100. The first imaging means 30 is, for example, a microscope having a CCD (Charge Coupled Device) image sensor or the like, and, based on the image picked up, alignment adjustment of the wafer 100 is conducted. The second imaging means (IR camera) 35 images the wafer 100 held on the chuck table 10 from the front surface 101 side, and generates an image of the back surface 104 of the wafer 100. Since infrared rays are longer in wavelength than visible rays and are hardly scattered, the infrared rays are transmitted through silicon or the like, whereby the back surface 104 of the wafer 100 can be imaged. Naturally, it is also possible to image the front surface 101 of the wafer 100 and to generate an image of the front surface 101, by use of the second imaging means (IR camera) 35.

The X-axis moving means 40 is mounted on an apparatus base 2, and moves the chuck table 10 in a cutting feed direction (X-axis direction). The cutting feed direction (X-axis direction) is orthogonal to the vertical direction. The X-axis moving means 40 includes an X-axis pulse motor 41, an X-axis ball screw 42, and a pair of X-axis guide rails 43. The chuck table 10 is mounted on the pair of X-axis guide rails 43, and the X-axis ball screw 42 is in screw engagement with a lower portion of the chuck table 10. The X-axis moving means 40 moves the chuck table 10 in the X-axis direction along the pair of X-axis guide rails 43 in relation to the apparatus base 2, through rotational driving of the X-axis ball screw 42 by a rotating force generated by the X-axis pulse motor 41.

The Y-axis moving means 50 is mounted on the apparatus base 2, and moves a cutting blade moving base 3 and the cutting means 20 in an indexing feed direction (Y-axis direction). Here, the indexing feed direction (Y-axis direction) is an axial direction of a rotary shaft of the cutting blade 21, and is orthogonal to both the cutting feed direction (X-axis direction) and the vertical direction. The Y-axis moving means 50 includes a Y-axis pulse motor 51, a Y-axis ball screw 52, and a pair of Y-axis guide rails 53. The cutting blade moving base 3 on which to mount the cutting means 20 is placed on the pair of Y-axis guide rails 53, and the Y-axis ball screw 52 is in screw engagement with a lower portion of the cutting blade moving base 3. The Y-axis moving means 50 moves the cutting blade moving base 3 and the cutting means 20 in the Y-axis direction along the Y-axis guide rails 53 in relation to the apparatus base 2, through rotational driving of the Y-axis ball screw 52 by a rotating force generated by the Y-axis pulse motor 51.

The Z-axis moving means 60 is mounted on the cutting blade moving base 3, and moves a support section 4 and the cutting means 20 in a cutting-in direction (Z-axis direction). The cutting-in direction (Z-axis direction) is the vertical direction, and is orthogonal to both the cutting feed direction (X-axis direction) and the indexing feed direction (Y-axis direction). The Z-axis moving means 60 is provided on the cutting blade moving base 3, and includes a Z-axis pulse motor 61, a Z-axis ball screw (not depicted), and a pair of Z-axis guide rails 63. The support section 4 on which to mount the cutting means 20 is connected to the pair of Z-axis guide rails 63, and the Z-axis ball screw is in screw engagement with the support section 4. The Z-axis moving means 60 moves the support section 4 and the cutting means 20 in the Z-axis direction in relation to the cutting blade moving base 3 while guiding them along the Z-axis guide rails 63, through rotation of the Z-axis ball screw by a rotating force generated by the Z-axis pulse motor 61.

The control unit 70 includes a processor composed, for example, of a CPU (Central Processing Unit) or the like, and a storage section that is composed of a ROM (Read Only Memory), a RAM (Random Access Memory), a hard disk or the like and that stores various data and programs. The control unit 70 has a function of controlling operations of the above-mentioned components, based on inputs made by an operator or a preset program or the like. In addition, the control unit 70 functions as image processing means that subjects the image picked up by the first imaging means 30 to pattern matching processing for alignment, and subjects the images picked up by the first imaging means 30 and the second imaging means 35 to image processing for kerf check and displays the processed data on the display unit 75.

The display unit 75 is a monitor composed, for example, of a LCD (Liquid Crystal Display) or the like, and displays the images processed by the control unit 70. In addition, an operation section (not depicted) composed of an input apparatus such as various switches or a touch panel is connected to the control unit 70, and the operator inputs instructions for the components of the cutting apparatus 1 through the operation section. For example, by operating the operation section, the operator can generate a picked-up image of the wafer 100 by use of at least one of the first imaging means 30 and the second imaging means 35.

Figure 3:
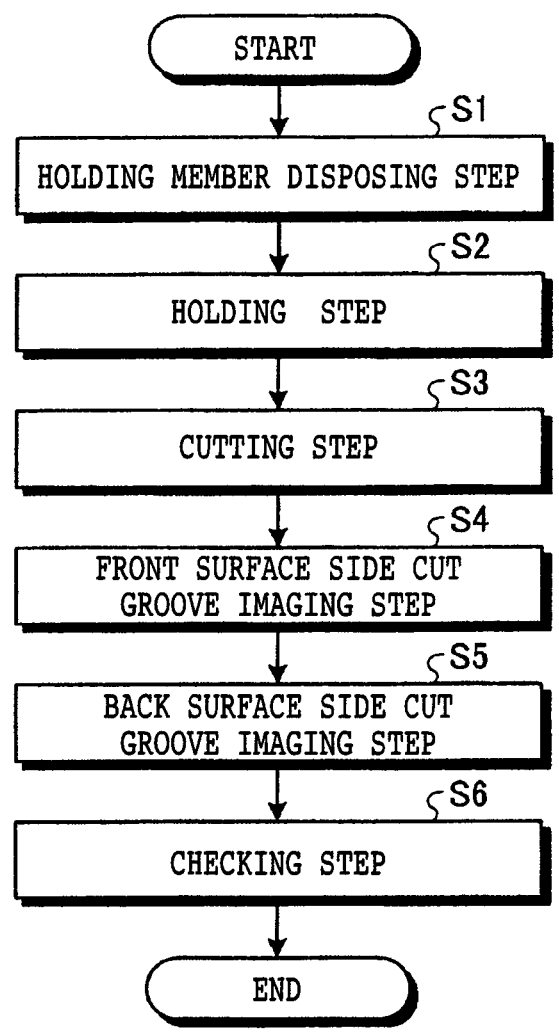
FIG. 3 is a flow chart depicting the procedure of the cutting method for a wafer.

In the configuration as above, the chuck table 10 with the wafer 100 supported thereon and the cutting means 20 are put into relative movements in the cutting feed direction (X-axis direction), the indexing feed direction (Y-axis direction), and the cutting-in direction (Z-axis direction), whereby cutting processing of the wafer 100 is performed. The cutting method according to the present embodiment will be described below. FIG. 3 is a flow chart depicting the procedure of the cutting method for a wafer.

In the present embodiment, as depicted in FIG. 3, the cutting method for the wafer (workpiece) 100 includes a holding member disposing step S1, a holding step S2, a cutting step S3, a front surface side cut groove imaging step S4, a back surface side cut groove imaging step S5, and a checking step S6. The order in which to carry out these steps is not limited to the one depicted in FIG. 3; for example, the back surface side cut groove imaging step S5 can be carried out prior to the front surface side cut groove imaging step S4. Each of these steps will now be described below.

[Holding Member Disposing Step S1]

In the holding member disposing step, as depicted in FIG. 2, the dicing tape 105 is adhered to the back surface 104 of the wafer 100, and the wafer 100 is supported on the annular frame 106 through the dicing tape (holding member) 105. The annular frame 106 has an opening larger than the wafer 100, and the wafer 100 is disposed inside the opening. Note that the wafer 100 may not necessarily be supported by the annular frame 106; for example, a disk-shaped dicing tape (holding member) 105 substantially the same in size as the wafer 100 may be adhered to the back surface 104 of the wafer 100.

[Holding Step S2]

Figure 4:
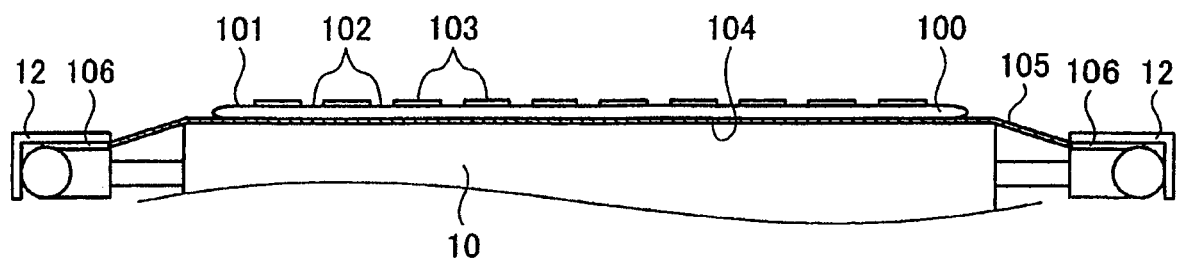
FIG. 4 is a side view depicting a state in which a wafer supported on the annular frame through a dicing tape is held on a chuck table.

FIG. 4 is a side view depicting a state in which the wafer supported on the annular frame through the dicing tape is held on the chuck table. The wafer 100 is placed on the chuck table 10 through the dicing tape 105, and is suction held by the holding section 11 (FIG. 1). In addition, the annular frame 106 is clamped by the clampers 12.

[Cutting Step S3]

Figure 5:
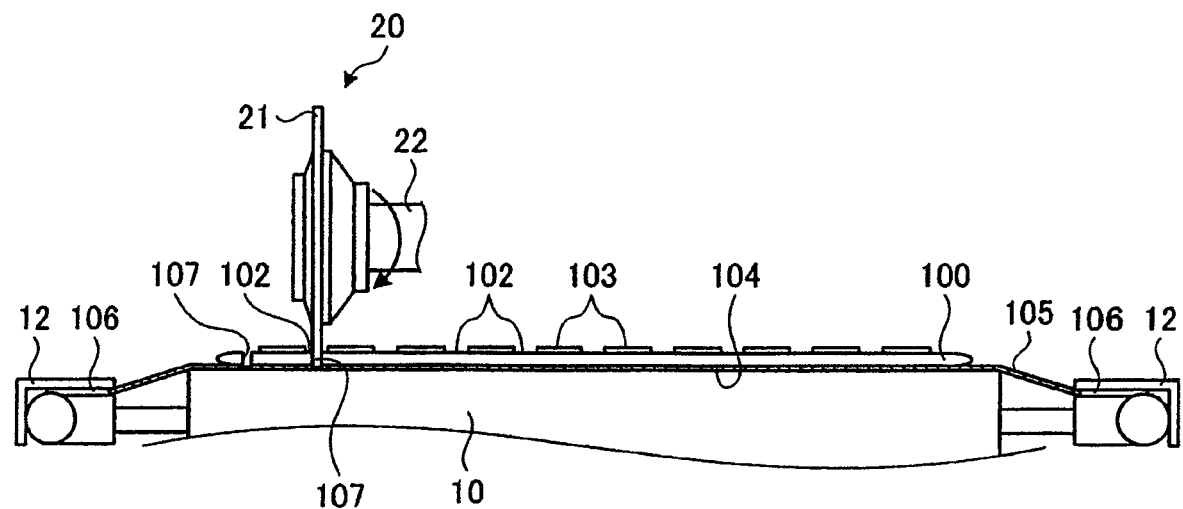
FIG. 5 is a side view depicting a state in which the wafer held on the chuck table is being cut by cutting means.

FIG. 5 is a side view depicting a state in which the wafer held on the chuck table is being cut by the cutting means. After alignment adjustment of the wafer 100 held on the chuck table 10 is conducted, cutting of the wafer 100 is performed. In this case, the cutting blade 21 of the cutting means 20 is disposed on the upper side of the division line 102 of the wafer 100, then, while the chuck table 10 with the wafer 100 held thereon and the cutting means 20 are in relative movement in the cutting feed direction (the X-axis direction in FIG. 1), the cutting blade 21 is rotated together with the spindle 22, and, keeping this state, the cutting blade 21 is made to cut into the wafer 100 until the tip of the cutting blade 21 reaches the dicing tape 105. As a result of this, a cut groove 107 is formed in the wafer 100 along the division line 102. Since the dicing tape 105 is not cut by the cutting blade 21, the wafer 100 is kept in the state of being held by the dicing tape 105.

[Front Surface Side Cut Groove Imaging Step S4]

Figure 6:
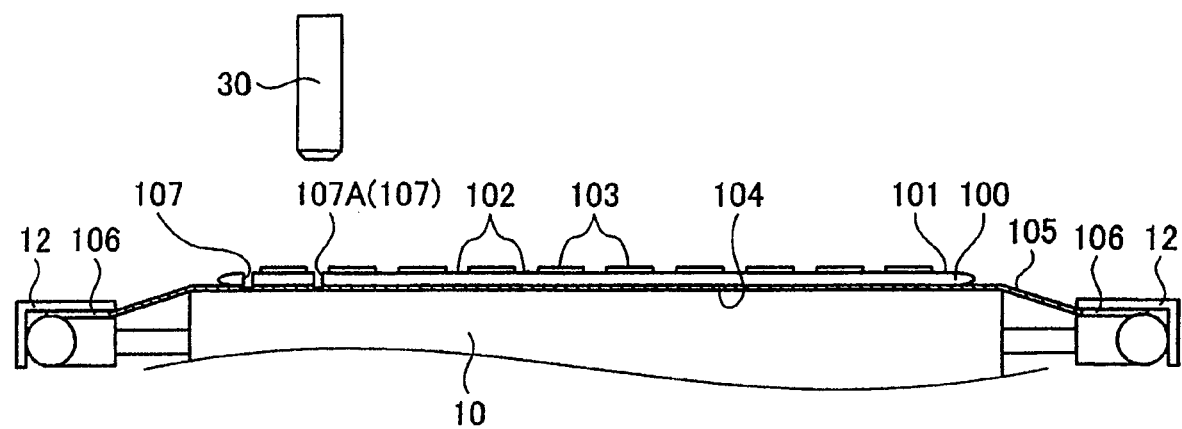
FIG. 6 is a side view depicting a state in which a front surface side of cut grooves of the wafer held on the chuck table is imaged by use of first imaging means.

FIG. 6 is a side view depicting a state in which the front surface side of a cut groove of the wafer held on the chuck table is imaged by use of the first imaging means. In the front surface side cut groove imaging step S4, the first imaging means 30 is disposed on the upper side of the cut groove 107 formed in the wafer 100, and images the cut groove 107. Specifically, the chuck table 10 is moved in such a manner that a coordinate position preset on the division line 102 (cut groove 107) of the wafer 100 is positioned beneath the first imaging means 30, and the first imaging means 30 performs imaging after the chuck table 10 is stopped at the coordinate position. As a result of this, the first imaging means 30 forms a picked-up image of a front surface portion 107A of the cut groove 107 from the front surface 101 side of the wafer 100, and the picked-up image is stored in the storage section possessed by the control unit 70. In this instance, control number information on the wafer 100, imaged coordinate position information and the like are stored together with the picked-up image. In the present embodiment, in the front surface side cut groove imaging step S4, each time a preset number of (for example, ten) cut grooves 107 have been formed, imaging of the thus formed cut grooves 107 is conducted. In this case, it is effective to preliminarily set those positions (for example, an entrance and an exit of the cutting blade 21 in relation to the wafer 100) at which defective cutting is empirically known to be liable to be generated, as the above-mentioned coordinate positions, and to perform the front surface side cut groove imaging step S4 for the cut grooves 107 at those positions. In addition, imaging may be performed in a central region between the entrance and the exit of the cutting blade 21 in relation to the wafer 100. Besides, the range from one end to the other end of the cut groove 107 may be imaged a plurality of times, so as thereby to check the whole part. In addition, imaging may be performed while keeping the first imaging means 30 and the chuck table 10 in relative movement along the cut groove 107. Besides, the front surface side cut groove imaging step S4 may be carried out for all the cut grooves 107.

[Back Surface Side Cut Groove Imaging Step S5]

Figure 7:
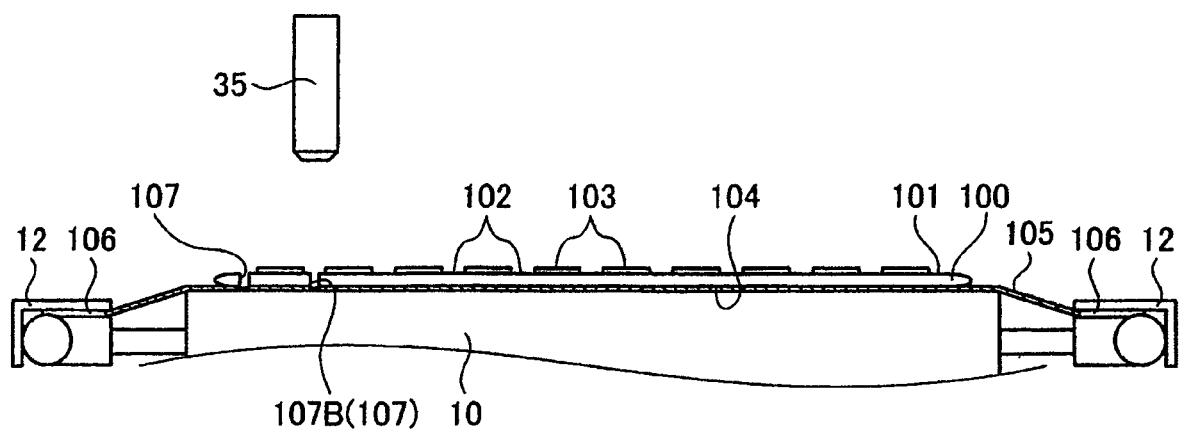
FIG. 7 is a side view depicting a state in which a back surface side of the cut grooves of the wafer held on the chuck table is imaged by use of second imaging means.

FIG. 7 is a side view depicting a state in which the back surface side of a cut groove of the wafer held on the chuck table is imaged by use of the second imaging means. The back surface side cut groove imaging step S5 is performed following to the front surface side cut groove imaging step S4 by the second imaging means 35. Specifically, the back surface side cut groove imaging step S5 is performed on the cut groove or grooves 107 imaged in the front surface side cut groove imaging step S4. The second imaging means 35 is disposed on the upper side of the relevant cut groove 107, and performs imaging, with the focal point positioned on the back surface 104 of the wafer 100. As a result of this, the second imaging means 35 forms a picked-up image of a back surface portion 107B of the cut groove 107 from the front surface 101 side of the wafer 100, and the picked-up image is stored in the storage section possessed by the control unit 70. In addition, imaging may be conducted while keeping the second imaging means 35 and the chuck table 10 in relative movement along the cut groove 107, in the state in which the focal point is positioned on the back surface 104 of the wafer 100. In the present embodiment, the second imaging means 35 performs imaging at the same coordinate position as the first imaging means 30. As a result, picked-up images of the front surface portion 107A and the back surface portion 107B of the cut groove 107 at the same coordinate position can be obtained.

[Checking Step S6]

Figure 8:
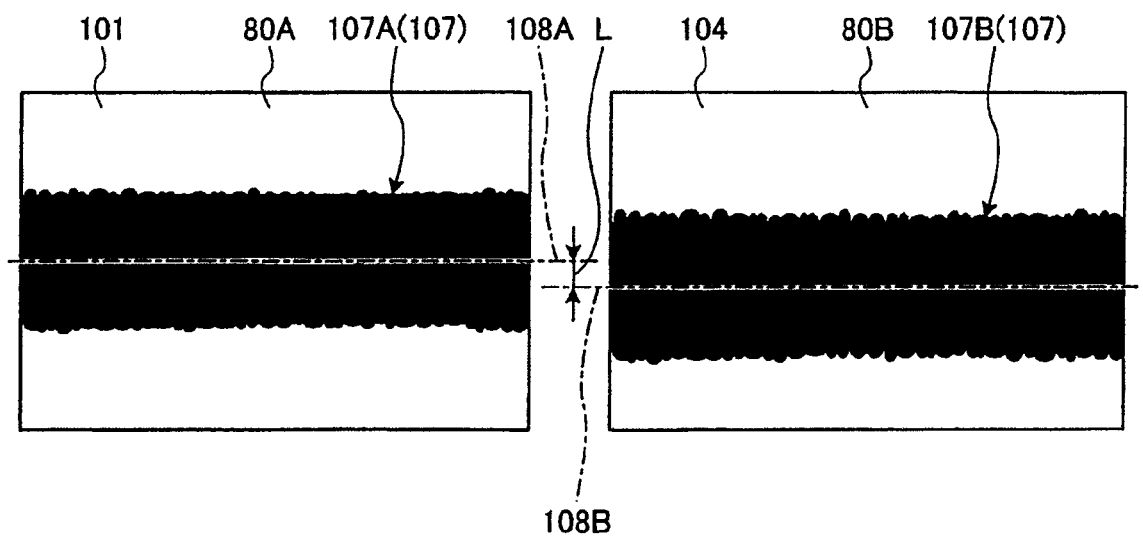
FIG. 8 is a figure depicting, in an aligned state, an example of a picked-up image of a cut groove on the front surface side imaged by the first imaging means and an example of a picked-up image of the cut groove on the back surface side imaged by the second imaging means.
Figure 9:
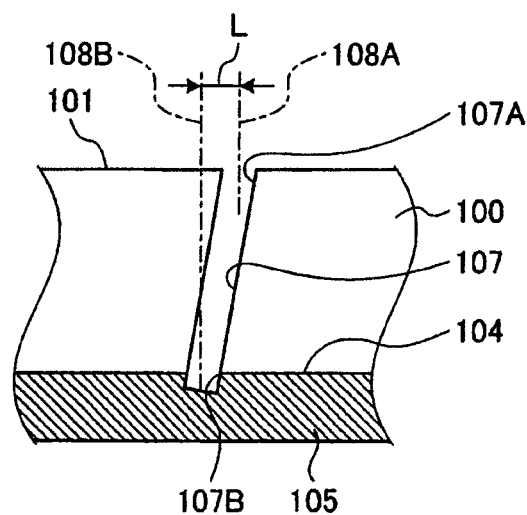
FIG. 9 is a partial sectional view of a wafer, depicting an example of the shape of a cut groove assumed from the front surface side cut groove picked-up image and the back surface side cut groove picked-up image.

FIG. 8 is a figure depicting, in an aligned state, an example of a picked-up image of a cut groove on the front surface side imaged by the first imaging means and an example of a picked-up image of the cut groove on the back surface side imaged by the second imaging means. FIG. 9 is a partial sectional view of a wafer, depicting an example of the shape of a cut groove assumed from the front surface side cut groove picked-up image and the back surface side cut groove picked-up image. In the checking step S6, the operator checks the picked-up images of the front surface portion 107A and the back surface portion 107B of the cut groove 107. Specifically, as depicted in FIG. 8, a front surface side cut groove picked-up image 80A and a back surface side cut groove picked-up image 80B at the same coordinate position are paired, and are displayed side by side on the display unit 75 (FIG. 1), for example. In the case where in regard of one cut groove 107, pluralities of the front surface portions 107A and the back surface portions 107B of the cut groove 107 at varied coordinate positions are imaged, the pairs of the front surface side cut groove picked-up image 80A and the back surface side cut groove picked-up image 80B are sequentially displayed on the display unit 75 (FIG. 1) by an operator's operation.

In this configuration, through the front surface side cut groove picked-up image 80A and the back surface side cut groove picked-up image 80B, not only the cut state of the front surface portion 107A of the cut groove 107 but also that of the back surface portion 107B of the cut groove 107 can be observed. Therefore, for example, based on the picked-up images, the control unit 70 can be made to calculate the size (maximum value, average value) of chipping generated at the front surface portion 107A and the back surface portion 107B of the cut groove 107, and it can be easily detected whether or not chipping greater than an allowable value has been generated at the front surface portion 107A or the back surface portion 107B. Here, in the case where chipping greater than an allowable value has been generated in at least one of the front surface portion 107A and the back surface portion 107B, the control unit 70 issues an alarm, and once stops the cutting of the wafer 100. The operator performs a treatment (for example, replacement or dressing of the cutting blade) as a countermeasure against the cause of generation of the chipping, whereby the possibility of production of defective chips can be lowered.

In addition, in this configuration, the front surface side cut groove picked-up image 80A and the back surface side cut groove picked-up image 80B at the same coordinate position are disposed side by side; therefore, the control unit 70 can easily detect the presence or absence of misregistration between a center line 108A of the front surface portion 107A of the cut groove 107 and a center line 108B of the back surface portion 107B of the cut groove 107. Here, in the case where misregistration by a distance L has been generated between the center line 108A of the front surface portion 107A of the cut groove 107 and the center line 108B of the back surface portion 107B of the cut groove 107, as depicted in FIG. 8, it is assumed that a cut groove 107 has been formed as a so-called slant cut, as depicted in FIG. 9. When the distance L in this instance is greater than an allowable value, the control unit 70 issues an alarm, and once stops the cutting of the wafer 100. The operator performs a correction (for example, an adjustment of cutting feed rate of the cutting blade 21 relative to the chuck table 10) for canceling the misregistration, starting from the cutting of the next division line 102, whereby the possibility of production of defective chips can be lowered, starting from the next division line 102.

The generation state of the above-mentioned slant cut varies according to the material of the wafer 100, the cutting-in depth, the processing feed rate and the like. Further, the generation state of the slant cut tends to vary among the entrance side, the exit side, and a position therebetween, of the cutting blade 21 in relation to the wafer 100. Therefore, in an existing configuration in which a check member such as a silicon piece or a carbon piece cut out into a bar shape is half cut, the thus cut check member is laid flat, and the groove shape is checked by imaging means such as a microscope, it has been impossible to determine whether or not a slant cut will be generated in the actual wafer 100. On the other hand, in the present embodiment, the presence or absence of the slant cut can be easily detected, from the front surface side cut groove picked-up image 80A and the back surface side cut groove picked-up image 80B at the same coordinate position.

Figure 10:
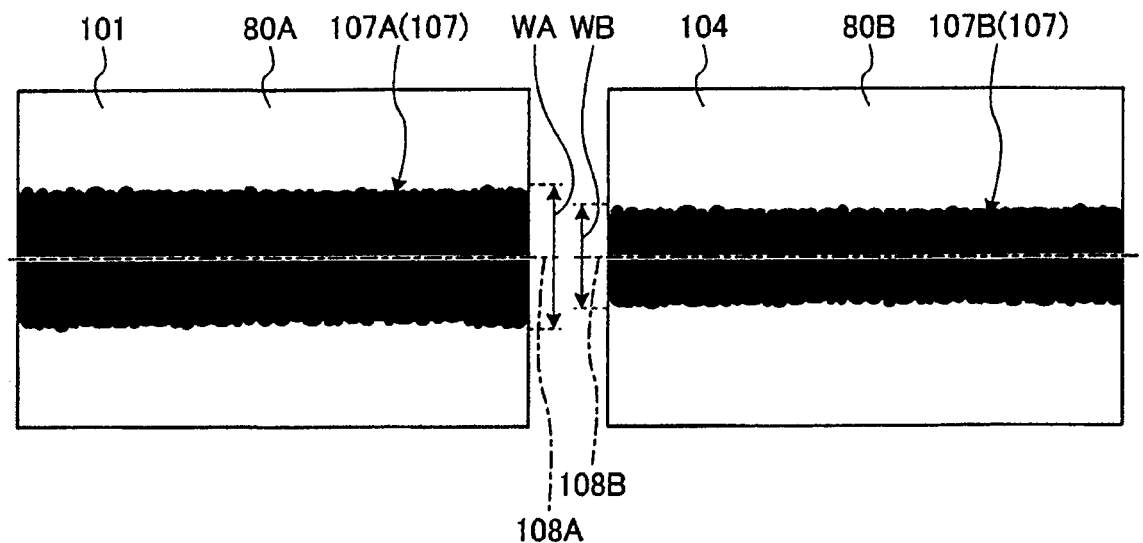
FIG. 10 is a figure depicting, in an aligned state, another example of a picked-up image of a cut groove on the front surface side imaged by the first imaging means and another example of a picked-up image of the cut groove on the back surface side imaged by the second imaging means.
Figure 11:
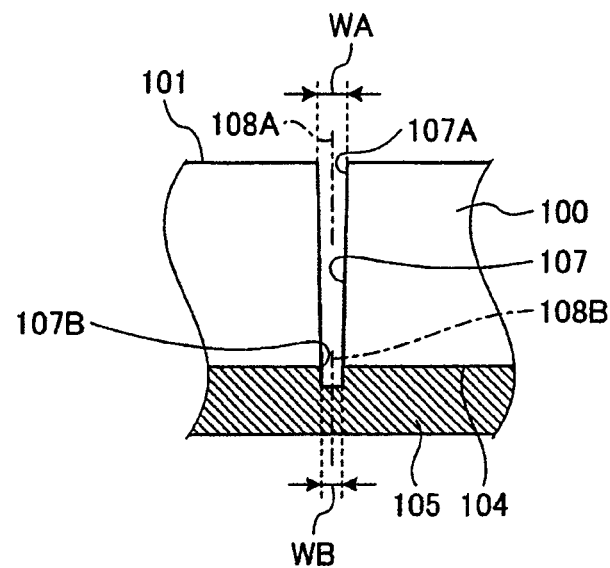
FIG. 11 is a partial sectional view of a wafer, depicting an example of the shape of a cut groove assumed from the front surface side cut groove picked-up image and the back surface side cut groove picked-up image.

In addition, in the checking step S6, so-called tapering can also be detected, in addition to the slant cut. FIG. 10 is a figure depicting, in an aligned state, another example of a picked-up image of a cut groove on the front surface side imaged by the first imaging means and another example of a picked-up image of the cut groove on the back surface side imaged by the second imaging means. FIG. 11 is a partial sectional view of a wafer, depicting an example of the shape of a cut groove assumed from the front surface side cut groove picked-up image and the back surface side cut groove picked-up image.

In this configuration, as depicted in FIG. 10, the control unit 70 calculates the difference between the width WA of the front surface portion 107A of a cut groove 107 and the width WB of the back surface portion 107B of the cut groove 107. In the case where there is generated a difference between the width WA of the front surface portion 107A of the cut groove 107 and the width WB of the back surface portion 107B of the cut groove 107, it is assumed that a so-called tapered cut groove 107 has been formed, as depicted in FIG. 11. When the difference between the width WA and the width WB in this instance is greater than an allowable value, the control unit 70 issues an alarm, and once stops the cutting of the wafer 100. The operator searches for the cause (for example, uneven wear of the cutting blade 21) of the tapering, and performs a treatment (for example, replacement or dressing of the cutting blade 21) as a countermeasure against the cause, whereby the possibility of production of defective chips can be lowered.

Now, another embodiment will be described below. While the cutting apparatus 1 has included the first imaging means 30 composed of a microscope or the like and the second imaging means 35 composed of an IR camera in the above-described embodiment, this is not limitative of the present invention; for example, the second imaging means 35 composed of the IR camera may be used also as the first imaging means 30. Specifically, the front surface portion 107A and the back surface portion 107B of the cut groove 107 are both imaged by use of the second imaging means 35 composed of the IR camera.

In this case, the front surface portion 107A of the cut groove 107 is imaged, with the focal point of the second imaging means 35 positioned on the front surface 101 of the wafer 100, and then the back surface portion 107B of the cut groove 107 is imaged, with the focal point of the second imaging means 35 positioned on the back surface 104 of the wafer 100. In this configuration, the front surface portion 107A and the back surface portion 107B of the cut groove 107 can both be imaged by adjusting the focal point of the second imaging means 35; therefore, the operating steps at the time of imaging, or the surface side cut groove imaging step S4 and the back surface side cut groove imaging step S5, can be simplified.

In addition, in the case where the thickness of the wafer 100 is not more than a predetermined value (for example, 80 μm), by, for example, positioning the focal point of the second imaging means 35 at an intermediate position between the front surface 101 and the back surface 104 of the wafer 100, it is possible to simultaneously image the front surface portion 107A and the back surface portion 107B of the cut groove 107, and it is possible to display the front surface portion 107A and the back surface portion 107B in the same picked-up image.

As has been described above, the cutting method according to the present embodiment is a cutting method for cutting the wafer 100 having the division lines 102 by the cutting blade 21. The cutting method includes: the holding member disposing step S1 of disposing the dicing tape 105 on the back surface 104 of the wafer 100; the holding step S2 of holding the wafer 100 on the chuck table 10 through the dicing tape 105; the cutting step S3 of causing the cutting blade 21 to cut into the wafer 100 held on the chuck table 10 until the tip of the cutting blade 21 reaches the dicing tape 105, and cutting the wafer 100 along the division lines 102 by the cutting blade 21 to form the cut grooves 107 reaching the dicing tape 105; the front surface side cut groove imaging step S4 of imaging the cut groove 107 formed in the cutting step S3 from the front surface 101 side of the wafer 100 by the first imaging means 30 to form the picked-up image of the front surface portion 107A of the cut groove 107 of the wafer 100; the back surface side cut groove imaging step S5 of imaging the cut groove 107 from the front surface 101 side of the wafer 100 by the second imaging means 35 to form the picked-up image of the back surface portion 107B of the cut groove 107; and the checking step S6 of checking the picked-up images of the front surface portion 107A and the back surface portion 107B of the cut groove 107. According to this configuration, not only the cut state of the front surface portion 107A of the cut groove 107 but also that of the back surface portion 107B of the cut groove 107 can be observed, through the picked-up images of the front surface portion 107A and the back surface portion 107B of the cut groove 107. Therefore, it can be easily detected, for example, whether or not chipping greater than an allowable value or slant cut or tapering of the cut groove 107 has been generated at the front surface portion 107A or the back surface portion 107B of the cut groove 107, so that the possibility of production of defective chips can be lowered.

Note that according to the cutting method according to the present embodiment as above, the following cutting apparatus can be obtained.

(Supplementary Note 1)

A cutting apparatus including: a holding table that holds a workpiece having division lines on a front surface thereof, through a holding member disposed on a back surface of the workpiece;

cutting means that has a cutting blade for cutting the workpiece held on the holding table and that cuts the workpiece along the division lines by the cutting blade to form cut grooves reaching the holding member;

a first imaging section that images the cut groove from the front surface side of the workpiece to form a picked-up image of a front surface portion of the cut groove;

a second imaging section that images the cut groove from the front surface side of the workpiece to form a picked-up image of a back surface portion of the cut groove; and a control unit that detects a defectively cut portion of the workpiece, based on the picked-up images of the front surface portion and the back surface portion of the cut groove.

According to the just-mentioned cutting apparatus, like in the cutting method according to the present embodiment, not only the cut state of the front surface portion 107A of the cut groove 107 but also that of the back surface portion 107B of the cut groove 107 can be observed, through the picked-up images of the front surface portion 107A and the back surface portion 107B of the cut groove 107. Therefore, detection of a defectively cut portion, such as detection of whether or not chipping greater than an allowable value or slant cut or tapering of the cut groove 107 has been generated at the front surface portion 107A or the back surface portion 107B of the cut groove 107, can be easily performed, and the possibility of production of defective chips can be lowered.

Note that the present invention is not limited to the above-described embodiments, and can be carried out with various modifications without departing from the gist of the invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting method for cutting a workpiece having division lines by a cutting blade, the cutting method comprising:
   a holding member disposing step of disposing a holding member on a back surface of the workpiece;
   a holding step of holding the workpiece on a holding table through the holding member;
   a cutting step of causing the cutting blade to cut into the workpiece held on the holding table until a tip of the cutting blade reaches the holding member, and cutting the workpiece along the division lines by the cutting blade to form cut grooves reaching the holding member; and
   a checking step of imaging the cut grooves formed in the cutting step from a front surface side of the workpiece by an imaging camera to form a picked-up image of the cut groove at the front surface of the workpiece, imaging through the cut groove from the front surface side of the workpiece by an infrared camera to form a picked-up image of the cut groove at the back surface of the workpiece, thereby checking the cut groove at the front surface and at the back surface,
   wherein the picked-up image of the cut groove at the front surface and the picked-up image of the cut groove at the back surface are obtained at a same coordinate position on the workpiece, and
   wherein a first centerline of the cut groove at the front surface and a second centerline of the cut groove at the back surface are compared from the picked-up image at the front surface and the picked-up image at the back surface to determine an alignment of the first centerline and the second centerline in the longitudinal direction.

2. The cutting method according to claim 1, wherein the infrared camera functions also as the imaging camera.

3. The cutting method according to claim 2, wherein in the checking step, the cut groove at the front surface is imaged by positioning a focal point of the infrared camera on the front surface of the workpiece, whereas the cut groove at the back surface is imaged by positioning the focal point of the infrared camera on the back surface of the workpiece.

4. The cutting method according to claim 1, wherein the cut groove is determined to be cut at a slant when the first and second centerlines are not aligned.

5. A cutting method for cutting a workpiece having division lines by a cutting blade, the cutting method comprising:
   a holding member disposing step of disposing a holding member on a back surface of the workpiece;
   a holding step of holding the workpiece on a holding table through the holding member;
   a cutting step of causing the cutting blade to cut into the workpiece held on the holding table until a tip of the cutting blade reaches the holding member, and cutting the workpiece along the division lines by the cutting blade to form cut grooves reaching the holding member; and
   a checking step of imaging the cut grooves formed in the cutting step from a front surface side of the workpiece by an imaging camera to form a picked-up image of the cut groove at the front surface of the workpiece, imaging through the cut groove from the front surface side of the workpiece by an infrared camera to form a picked-up image of the cut groove at the back surface of the workpiece, thereby checking the cut groove at the front surface and at the back surface,
   wherein the picked-up image of the cut groove at the front surface and the picked-up image of the cut groove at the back surface are obtained at a same coordinate position on the workpiece, and
   wherein a first width of the cut groove at the front surface is compared with a second width of the cut groove at the back surface from the picked-up image at the front surface and the picked-up image at the back surface.

6. The cutting method according to claim 5, wherein the infrared camera functions also as the imaging camera.

7. The cutting method according to claim 6, wherein in the checking step, the cut groove at the front surface is imaged by positioning a focal point of the infrared camera on the front surface of the workpiece, whereas the cut groove at the back surface is imaged by positioning the focal point of the infrared camera on the back surface of the workpiece.

8. The cutting method according to claim 5, wherein the cut groove is determined to be tapered when the first width and the second width are different.

* * * * *